(12) United States Patent
Kurita et al.

(10) Patent No.: US 7,800,462 B2
(45) Date of Patent: *Sep. 21, 2010

(54) PRINTED BOARD AND FILTER USING THE SAME

(75) Inventors: Junichi Kurita, Osaka (JP); Kenji Kuranuki, Kyoto (JP); Youichi Aoshima, Osaka (JP); Hiroshi Higashitani, Osaka (JP); Tsuyoshi Yoshino, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/404,999

(22) Filed: Mar. 16, 2009

(65) Prior Publication Data
US 2009/0174502 A1 Jul. 9, 2009

Related U.S. Application Data

(63) Continuation of application No. PCT/JP2007/070599, filed on Oct. 23, 2007.

(30) Foreign Application Priority Data
Oct. 25, 2006 (JP) ............................. 2006-289827

(51) Int. Cl.
*H03H 7/00* (2006.01)
*H01G 9/04* (2006.01)
(52) U.S. Cl. ..................... 333/185; 333/184; 361/271; 361/278
(58) Field of Classification Search ............... 333/182, 333/184, 185; 361/271, 278, 298.1, 299.1, 361/299.2
See application file for complete search history.

(56) References Cited

U.S. PATENT DOCUMENTS

| 6,094,112 | A | * | 7/2000 | Goldberger et al. | 333/185 |
| 6,236,561 | B1 | * | 5/2001 | Ogino et al. | 361/523 |
| 6,646,523 | B2 | * | 11/2003 | Arai et al. | 333/184 |
| 6,836,401 | B2 | * | 12/2004 | Yoshida et al. | 361/538 |
| 6,853,268 | B2 | * | 2/2005 | Harada | 333/185 |
| 6,920,037 | B2 | * | 7/2005 | Sano et al. | 361/540 |

(Continued)

FOREIGN PATENT DOCUMENTS

JP 58-073201 5/1983

(Continued)

OTHER PUBLICATIONS

International Search Report issued Jan. 22, 2008 in the International (PCT) Application of which the present application is a continuation.

*Primary Examiner*—Robert Pascal
*Assistant Examiner*—Kimberly E Glenn
(74) *Attorney, Agent, or Firm*—Wenderoth, Lind & Ponack L.L.P.

(57) ABSTRACT

A printed board is mounted with a chip-type solid electrolytic capacitor of a four-terminal structure where a pair of positive electrode terminals are disposed at opposite positions and a pair of negative electrode terminals are disposed at opposite positions on a mounting surface. The printed board has a pair of positive electrode patterns and a pair of negative electrode patterns to which the positive electrode terminals and negative electrode terminals of the chip-type solid electrolytic capacitor are connected, respectively. The printed board further has an inductor section that is insulated from the negative electrode patterns, and electrically connects the positive electrode patterns.

8 Claims, 8 Drawing Sheets

U.S. PATENT DOCUMENTS

| | | |
|---|---|---|
| 7,005,944 B2 * | 2/2006 | Arai et al. .................... 333/185 |
| 7,057,882 B2 * | 6/2006 | Fujii et al. .................. 361/540 |
| 7,215,533 B2 | 5/2007 | Kurita et al. |
| 7,411,775 B2 * | 8/2008 | Togashi ...................... 361/303 |
| 7,468,881 B2 * | 12/2008 | Sato et al. ................ 361/306.3 |
| 2002/0015277 A1 | 2/2002 | Nitoh et al. |
| 2002/0024407 A1 | 2/2002 | Arai et al. |
| 2002/0141141 A1 | 10/2002 | Nitoh et al. |
| 2004/0201949 A1 | 10/2004 | Kida et al. |

FOREIGN PATENT DOCUMENTS

| | | |
|---|---|---|
| JP | 5-87941 | 11/1993 |
| JP | 2001-230156 | 8/2001 |
| JP | 2002-164760 | 6/2002 |
| JP | 2004-363526 | 12/2004 |

\* cited by examiner

PRINTED BOARD AND FILTER USING THE SAME

This application is a continuation of International Application PCT/JP2007/070599, Filed Oct. 23, 2007.

BACKGROUND OF THE INVENTION

1. Field of the Invention

The present invention relates to a printed board for a filter used in various electronic devices, and a filter formed by mounting a chip-type solid electrolytic capacitor on the printed board.

2. Background Art

In response to the increase in frequencies of electronic devices, there has risen a demand for a capacitor, as one type of electronic component that has a high impedance characteristic in a region of a frequency higher than that in a conventional capacitor. In order to meet such demand, various solid electrolytic capacitors containing conductive polymer of high electric conductivity as a solid electrolyte have been developed. Such solid electrolytic capacitors have large capacitance, so that they are used in π-type filters for cutting high-frequency components in signals.

FIG. 5 is a top view showing a wiring pattern of a printed board for forming a conventional filter employing a chip-type solid electrolytic capacitor. FIG. 6 is a front view of a mounting surface of the chip-type solid electrolytic capacitor to be mounted on the printed board. FIG. 7 is a top view showing a state where the chip-type solid electrolytic capacitor and a chip inductor are mounted on the printed board.

Printed board (hereinafter referred to as "board") 60 has pattern 61 through pattern 64. Chip inductor 65 is mounted between pattern 61 and pattern 62. Chip-type solid electrolytic capacitor (hereinafter referred to as "capacitor") 50 has a four-terminal structure. Capacitor 50 includes a plurality of capacitor elements (not shown), and these capacitor elements are divided into two groups. Positive electrodes in one group are connected to terminal 51, and positive electrodes in the other group are connected to terminal 52. Negative electrodes of these capacitor elements are connected to terminals 53 and 54. Terminal 51 is connected to pattern 61, terminal 52 is connected to pattern 62, terminal 53 is connected to pattern 63, and terminal 54 is connected to pattern 64. Thus, a π-type filter is formed. Equivalent series inductance (ESL) of capacitor 50 is reduced by such a structure.

In the conventional filter, capacitor 50 and chip inductor 65 are combined and mounted on board 60. In order to improve the high frequency-cutting property of the π-type filter, large chip inductor 65 is required. Mounting such chip inductor 65 occupies the area on board 60. Therefore, it is difficult to downsize the π-type filter.

SUMMARY OF THE INVENTION

On a printed board of the present invention, a chip-type solid electrolytic capacitor of a four-terminal structure is mounted. Here, in the four-terminal structure, a pair of positive electrode terminals are disposed at opposite positions and a pair of negative electrode terminals are disposed at opposite positions on a mounting surface. The printed board has a pair of positive electrode patterns and a pair of negative electrode patterns. The positive electrode terminals of the chip-type solid electrolytic capacitor are connected to the pair of positive electrode patterns, respectively. The negative electrode terminals of the chip-type solid electrolytic capacitor are connected to the pair of negative electrode patterns, respectively. The printed board has an inductor section that is insulated from the negative electrode patterns, and electrically connects the positive electrode patterns. By mounting the chip-type solid electrolytic capacitor on the printed board of the present invention, the small π-type filter can be formed.

DETAILED DESCRIPTION OF THE INVENTION

Figure 1:
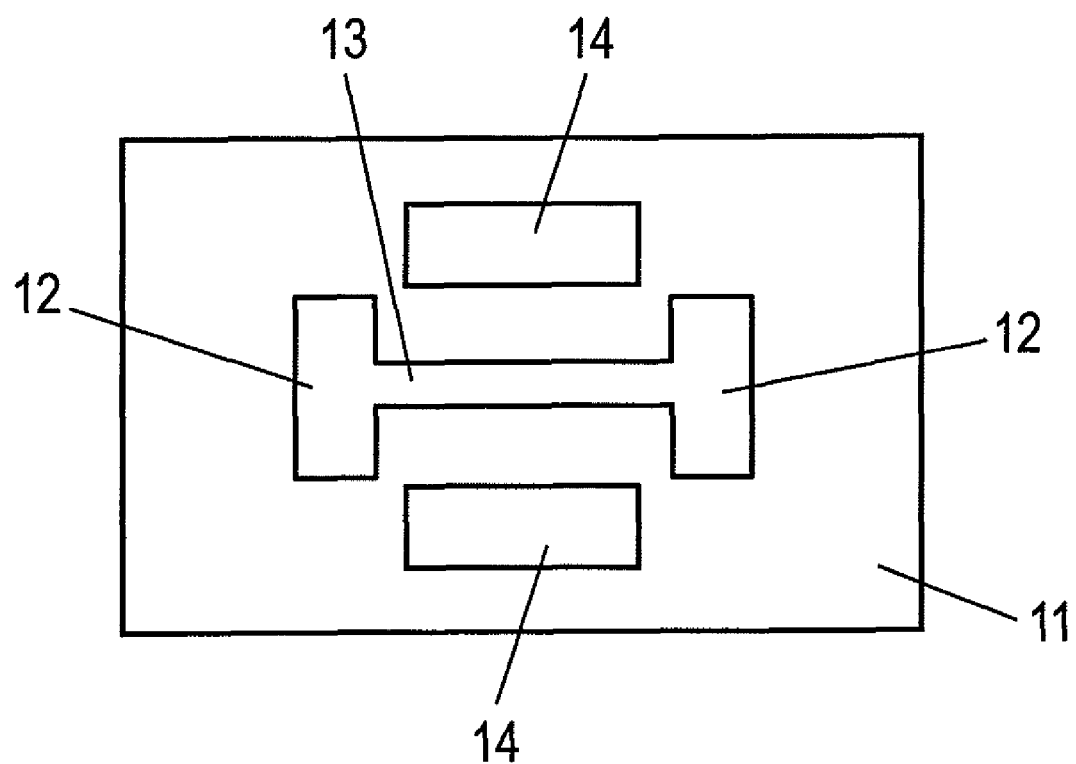
FIG. 1 is a plan view of a printed board in accordance with an exemplary embodiment of the present invention.
Figure 2A:
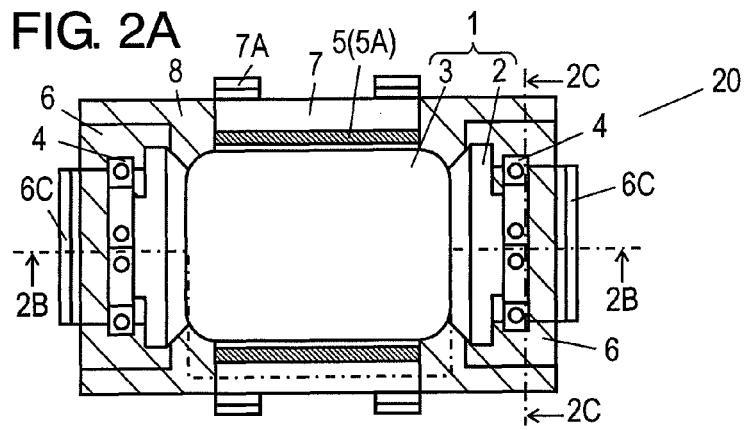
FIG. 2A is a top sectional view of a chip-type solid electrolytic capacitor to be mounted on the printed board in accordance with the exemplary embodiment.
Figure 2B:
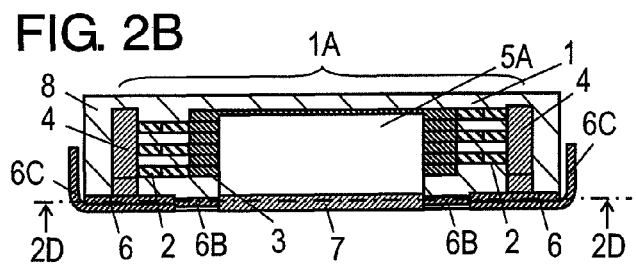
FIG. 2B is a front sectional view taken along the line 2B-2B of the chip-type solid electrolytic capacitor shown in FIG. 2A.
Figure 2C:
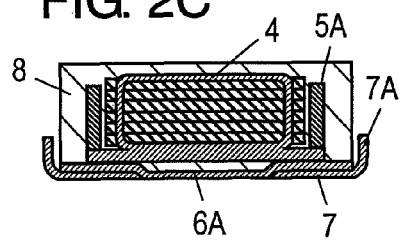
FIG. 2C is a side sectional view taken along the line 2C-2C of the chip-type solid electrolytic capacitor shown in FIG. 2A.
Figure 2D:
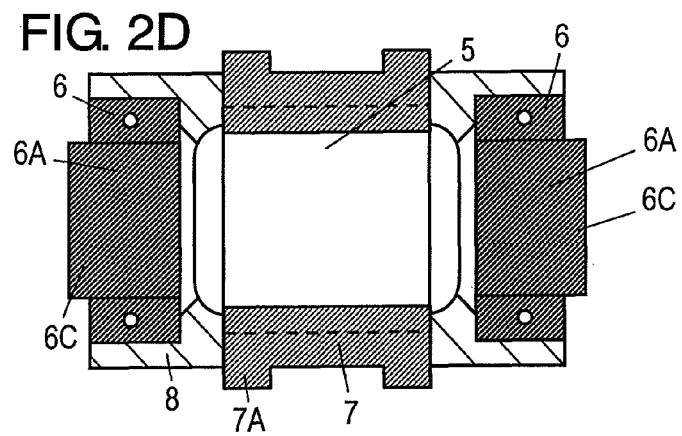
FIG. 2D is a bottom sectional view of the chip-type solid electrolytic capacitor shown in FIG. 2A.
Figure 2E:
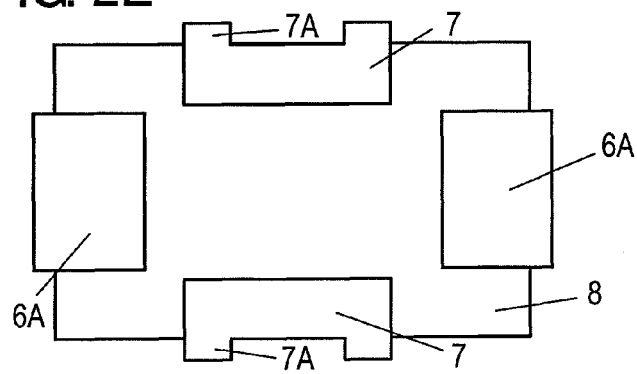
FIG. 2E is a bottom view of the chip-type solid electrolytic capacitor shown in FIG. 2A.
Figure 2F:
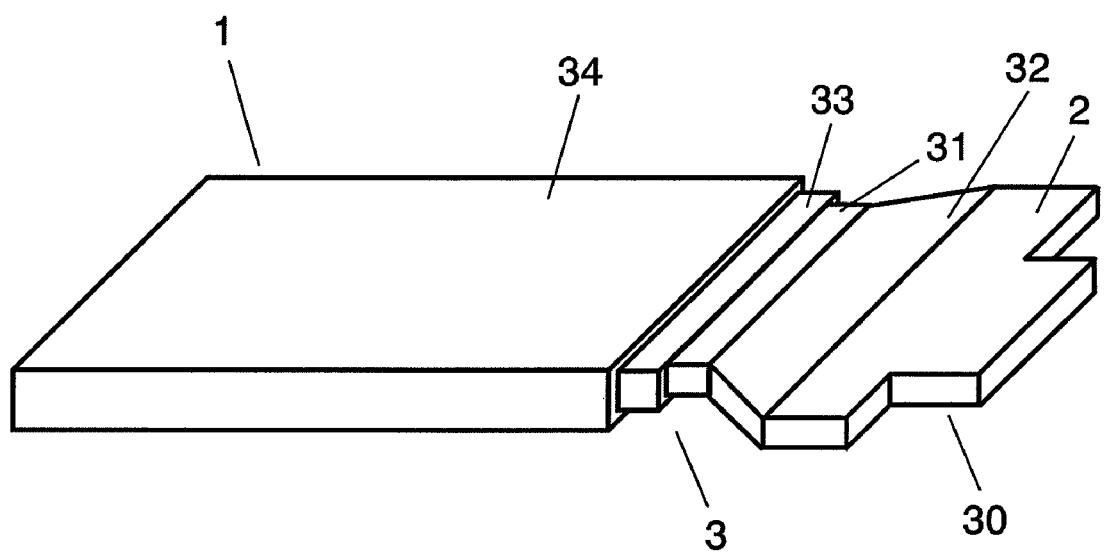
FIG. 2F is a partially cutaway perspective view of a capacitor element in the chip-type solid electrolytic capacitor shown in FIG. 2A.

FIG. 1 is a plan view showing a structure of printed board (hereinafter referred to as "board") 11 in accordance with an exemplary embodiment of the present invention. FIG. 2A through FIG. 2E show a structure of chip-type solid electrolytic capacitor (hereinafter referred to as "capacitor") 20 to be mounted on board 11. FIG. 2A is a top sectional view, FIG. 2B is a front sectional view taken along the line 2B-2B in FIG. 2A, FIG. 2C is a side sectional view taken along the line 2C-2C in FIG. 2A, FIG. 2D is a bottom sectional view taken along the line 2D-2D in FIG. 2B, and FIG. 2E is a bottom view. FIG. 2F is a partially cutaway perspective view of capacitor element 1 in capacitor 20.

In FIG. 1, a pair of positive electrode patterns 12, inductor section 13, and a pair of negative electrode patterns 14 are formed on board 11. Inductor section 13 is disposed so as to electrically connect positive electrode patterns 12 while being insulated from negative electrode patterns 14. Inductor section 13 is made of metal such as copper, gold, and nickel. Inductor section 13 may be made of the same material as that of positive electrode patterns 12.

As shown in FIG. 2F, capacitor element 1 has positive electrode body 30 made of valve action metal such as aluminum. Insulating section 32 is disposed at a predetermined position of positive electrode body 30, so that positive electrode body 30 is divided into positive electrode section 2 and a negative electrode forming section (not shown). The surface of the negative electrode forming section of positive electrode body 30 is roughened, and then dielectric oxide layer 31 is formed on the surface. Solid electrolyte layer 33 made of conductive polymer and negative electrode layer 34 made of carbon and silver paste are sequentially stacked on dielectric oxide layer 31, thereby forming negative electrode section 3. Capacitor element 1 is formed in a flat plate shape.

As shown in FIG. 2B, a plurality of capacitor elements 1 are stacked through negative electrode sections 3 so that positive electrode sections 2 are disposed in the alternately opposite directions, thereby forming laminated body 1A. In other words, in FIG. 2A, capacitor elements 1 including positive electrode section 2 on the right side constitute a first group, and capacitor elements 1 including positive electrode section 2 on the left side constitute a second group. Positive electrode sections 2 of capacitor elements 1 in the first group are disposed on the opposite side to positive electrode sections 2 of capacitor elements 1 in the second group with respect to negative electrode sections 3. FIG. 2B shows a case where the number of capacitor elements 1 is six as an example, but the number is not limited. Each of the first group and second group is required to be formed of one or more capacitor elements 1.

As shown in FIG. 2A through FIG. 2C, a pair of positive electrode lead frames 4 integrally couple between positive electrode sections 2 positioned at both ends of laminated body 1A, respectively. In other words, each positive electrode lead frame 4 is wound on the outer periphery of positive electrode sections 2 at each end, and couples positive electrode sections 2 by resistance welding or the like so as to bundle positive electrode sections 2. Negative electrode lead frame 5 is joined to the lower surface of negative electrode sections 3 positioned in the center of laminated body 1A through conductive silver paste (not shown). Guide walls 5A are disposed at both ends of negative electrode lead frame 5. More specifically, guide walls 5A are disposed at both ends of negative electrode lead frame 5 in the direction crossing the connecting direction between positive electrode terminals 6. The inner surfaces of guide walls 5A are electrically connected to negative electrode sections 3 through conductive silver paste. Such positive electrode lead frames 4 and negative electrode lead frame 5 are not always required, and positive electrode sections 2 and negative electrode sections 3 may be directly joined to positive electrode terminals 6 and negative electrode terminals 7 (described later).

As shown in FIG. 2A through FIG. 2D, a pair of positive electrode terminals 6 are joined to the lower surfaces of positive electrode lead frames 4, respectively. Parts of positive electrode terminals 6 are extended so as to project from outer resin 8 (described later) in the view from the top surface, and the extended parts are folded upward along the side surface of outer resin 8, thereby forming folded sections 6C. Positive electrode terminals 6 are electrically connected to positive electrode sections 2 of capacitor elements 1 in the first group and positive electrode sections 2 of capacitor elements 1 in the second group through positive electrode lead frames 4, respectively.

A pair of negative electrode terminals 7 are joined to both ends of the lower surface of negative electrode lead frame 5. In other words, negative electrode terminals 7 are electrically connected to negative electrode sections 3 positioned in the center of laminated body 1A through lead frame 5, and are disposed at both ends in the direction crossing the connecting direction between positive electrode terminals 6, respectively. Parts of negative electrode terminals 7 are extended so as to project from outer resin 8 in the view from the top surface, and the extended parts are folded upward along the side surface of outer resin 8, thereby forming folded sections 7A.

Insulating outer resin 8 integrally covers laminated body 1A, positive electrode lead frames 4, negative electrode lead frame 5, parts of positive electrode terminals 6, and parts of negative electrode terminals 7. On the lower surface as the mounting surface, terminal sections 6A of positive electrode terminals 6 are exposed at two opposite positions, and negative electrode terminals 7 are exposed at two opposite positions. In other words, outer resin 8 covers laminated body 1A in a state where parts of at least the surfaces as the mounting surfaces of positive electrode terminals 6 and parts of at least the surfaces as the mounting surfaces of negative electrode terminals 7 are exposed.

Thus, capacitor 20 has a four-terminal structure where terminal sections 6A of positive electrode terminals 6 are exposed at two opposite positions and negative electrode terminals 7 are exposed at two opposite positions on the lower surface as the mounting surface. Thanks to this structure, magnetic fluxes generated by currents flowing between the terminals cancel each other, and hence ESL can be significantly reduced. The loop length of current is further reduced by minimizing the distance between terminals, thereby further reducing the ESL.

A π-type filter can be formed by mounting such capacitor 20 whose ESL is reduced on board 11. At this time, terminal sections 6A are connected to positive electrode patterns 12 disposed on board 11, and negative electrode terminals 7 are connected to negative electrode patterns 14. In other words, capacitor 20 is disposed so that inductor section 13 for electrically connecting positive electrode patterns 12 is positioned at the mounting position of capacitor 20.

Inductor section 13 for electrically connecting positive electrode patterns 12 electrically connects positive electrode terminals 6. Accordingly, inductor section 13 is connected between the resultant capacitance of a plurality of capacitor elements 1 in the first group and the resultant capacitance of a plurality of capacitor elements 1 in the second group in FIG. 2A. Thus, a downsized π-type filter whose ESL is reduced can be formed. A chip inductor is not required to be separately prepared.

The parts of positive electrode terminals 6 and negative electrode terminals 7 are extended, and are folded upward along the side surface of outer resin 8, thereby forming folded sections 6C and 7A. Thanks to this structure, not only is a soldering fillet easily formed during soldering work, but also the soldering state can be recognized from above. Therefore, the reliability of the soldering work is improved.

In the present embodiment, the example where laminated body 1A is formed by stacking six capacitor elements 1 has been described. However, the present invention is not limited to this. The number of stacked capacitor elements 1 may be appropriately determined in response to a desired specification, and may be odd. However, it is more preferable that the number is even. That is because the magnetic fluxes generated by currents flowing in respective capacitor elements 1 can cancel each other. In the present embodiment, laminated body 1A is formed so that positive electrode sections 2 are disposed in the alternately opposite directions. However, the present invention is not limited to this. Laminated body 1A may be formed so that positive electrode sections 2 are disposed in opposite directions in a random fashion. However, it is preferable that laminated body 1A is formed so that positive electrode sections 2 are disposed in the alternately opposite directions. That is because current paths flowing in capacitor elements 1 are more symmetric and hence the magnetic fluxes cancel each other more effectively.

In the present embodiment, inductor section 13 is disposed on the mounting surface of capacitor 20 on board 11. However, the present invention is not limited to this. Inductor section 13 may be formed on the back side surface of the mounting surface of capacitor 20. Alternatively, board 11 of a multilayer structure is used and inductor section 13 may be formed in an inner layer.

Figure 3:
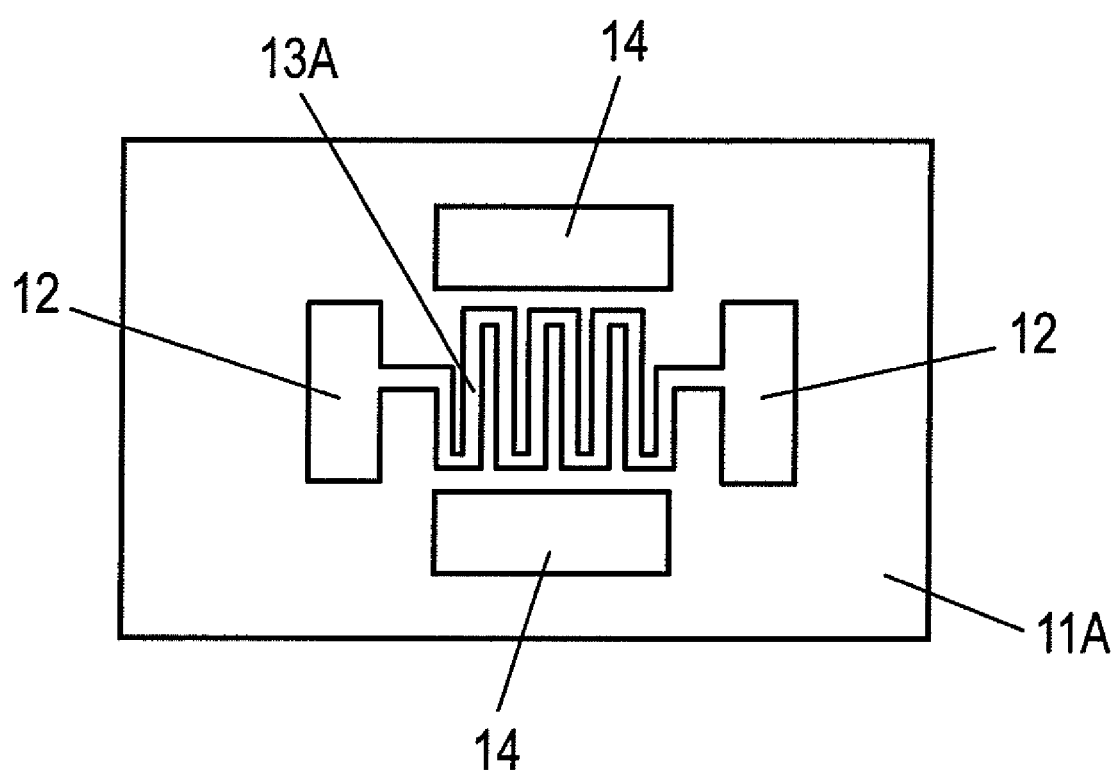
FIG. 3 is a plan view of another printed board in accordance with the exemplary embodiment of the present invention.

Next, a printed board having an inductor section of a different shape is described. FIG. 3 is a plan view of another printed board (hereinafter referred to as "board") 11A in accordance with the exemplary embodiment of the present invention. This structure differs from the structure in FIG. 1 in that inductor section 13A has a meandering shape. A π-type filter can be formed by mounting capacitor 20 shown in FIG. 2A through FIG. 2E on board 11A. Since inductor section 13A has the meandering shape, the degree of freedom in varying the inductance value of inductor section 13A is increased. Therefore, the impedance value can be easily controlled. In addition, the impedance value can be controlled in a wide frequency band from about 100 kHz to about 1 GHz.

Inductor section 13A has a rectangular meandering shape in FIG. 3; however, it may have a curved meandering shape. Alternatively, instead of the meandering shape, double spirals may be interconnected on one plane, or double spirals may be disposed on different planes and interconnected, for example. In other words, the current path of inductor section 13A is required to be longer than the distance between positive electrode patterns 12.

Figure 4A:
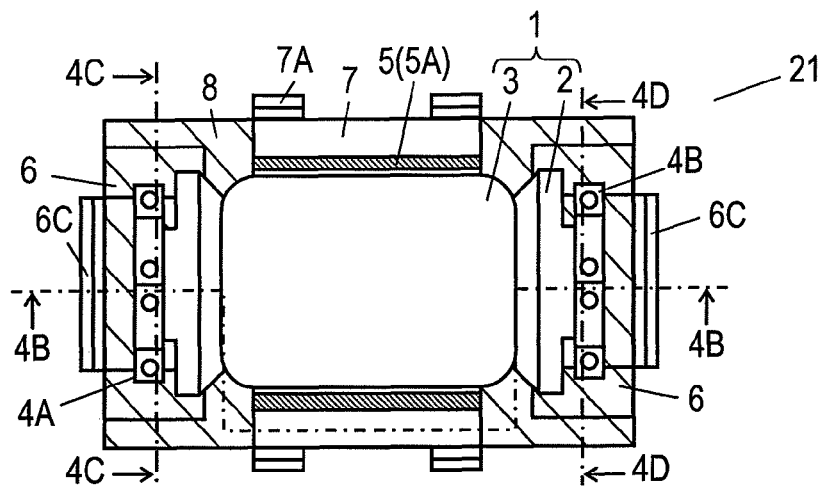
FIG. 4A is a plan sectional view of another chip-type solid electrolytic capacitor to be mounted on the printed board in accordance with the exemplary embodiment.
Figure 4B:
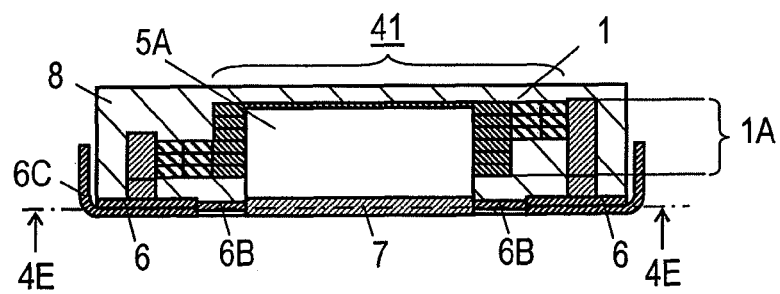
FIG. 4B is a front sectional view of the chip-type solid electrolytic capacitor shown in FIG. 4A.
Figure 4C:
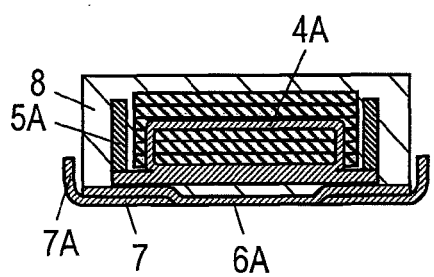
FIG. 4C is a side sectional view taken along the line 4C-4C of the chip-type solid electrolytic capacitor shown in FIG. 4A.
Figure 4D:
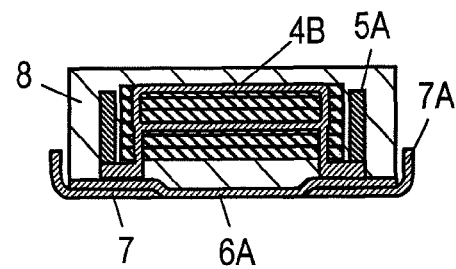
FIG. 4D is a side sectional view taken along the line 4D-4D of the chip-type solid electrolytic capacitor shown in FIG. 4A.
Figure 4E:
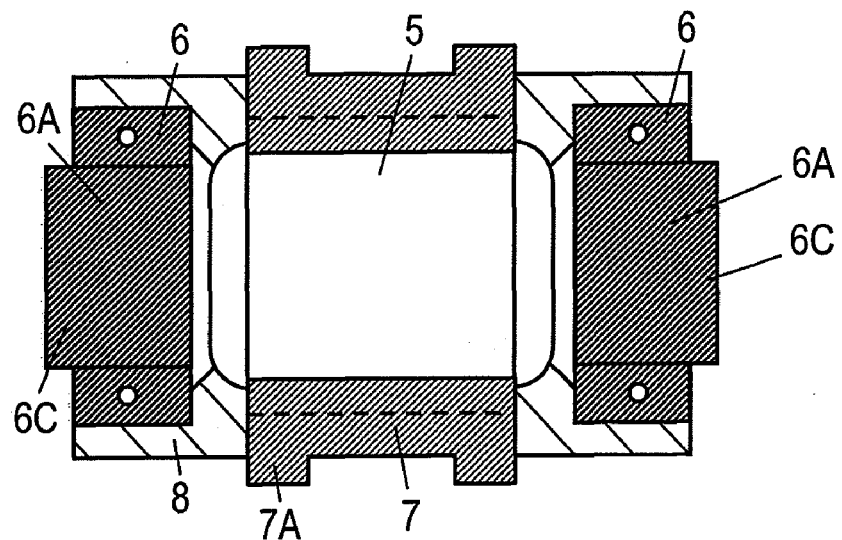
FIG. 4E is a bottom sectional view of the chip-type solid electrolytic capacitor shown in FIG. 4A.
Figure 4F:
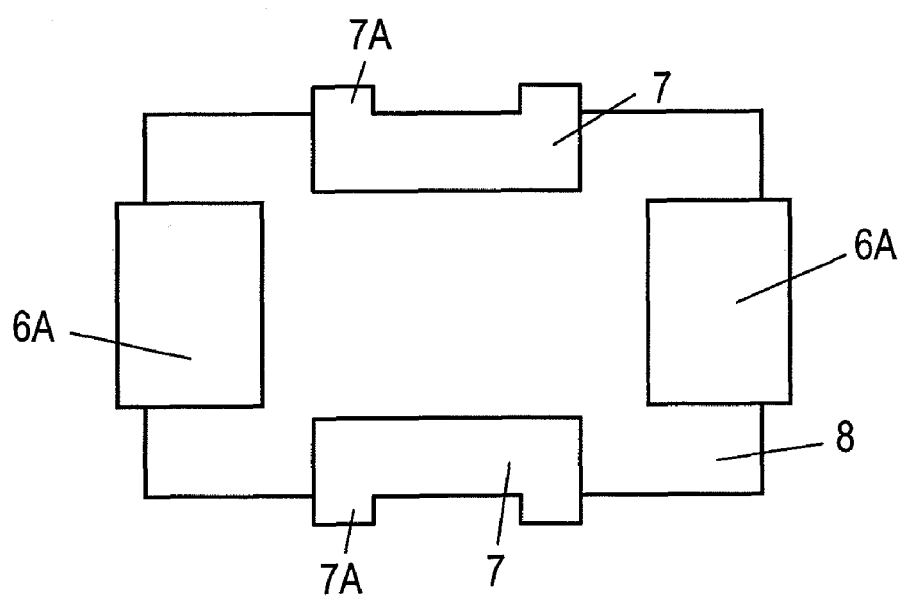
FIG. 4F is a bottom view of the chip-type solid electrolytic capacitor shown in FIG. 4A.
Figure 5:
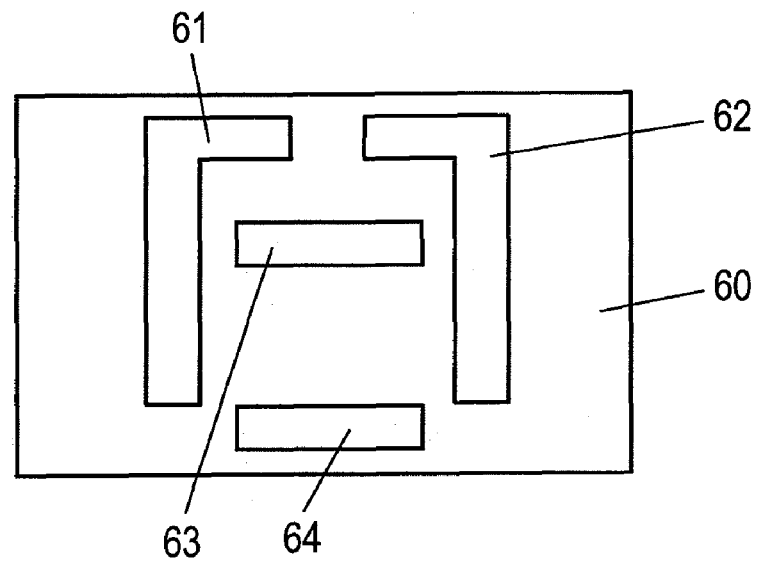
FIG. 5 is a top view of a printed board for forming a conventional filter employing a chip-type solid electrolytic capacitor.
Figure 6:
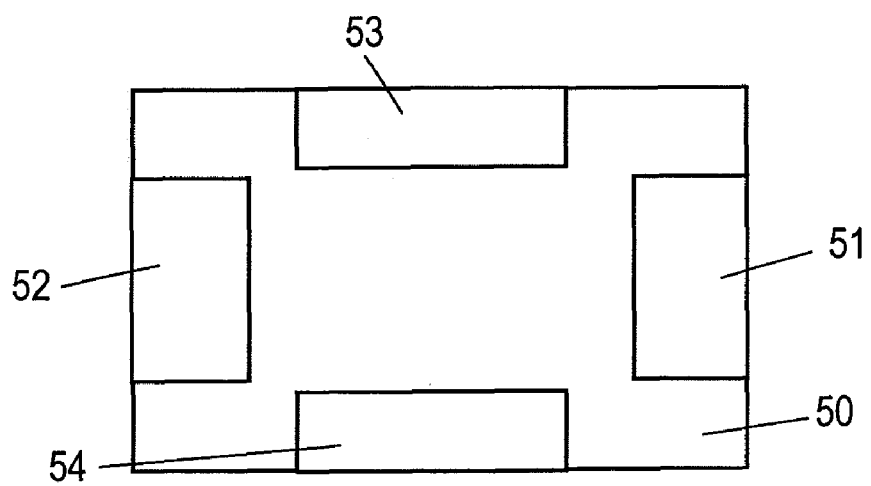
FIG. 6 is a front view of a mounting surface of the chip-type solid electrolytic capacitor to be mounted on the printed board shown in FIG. 5.
Figure 7:
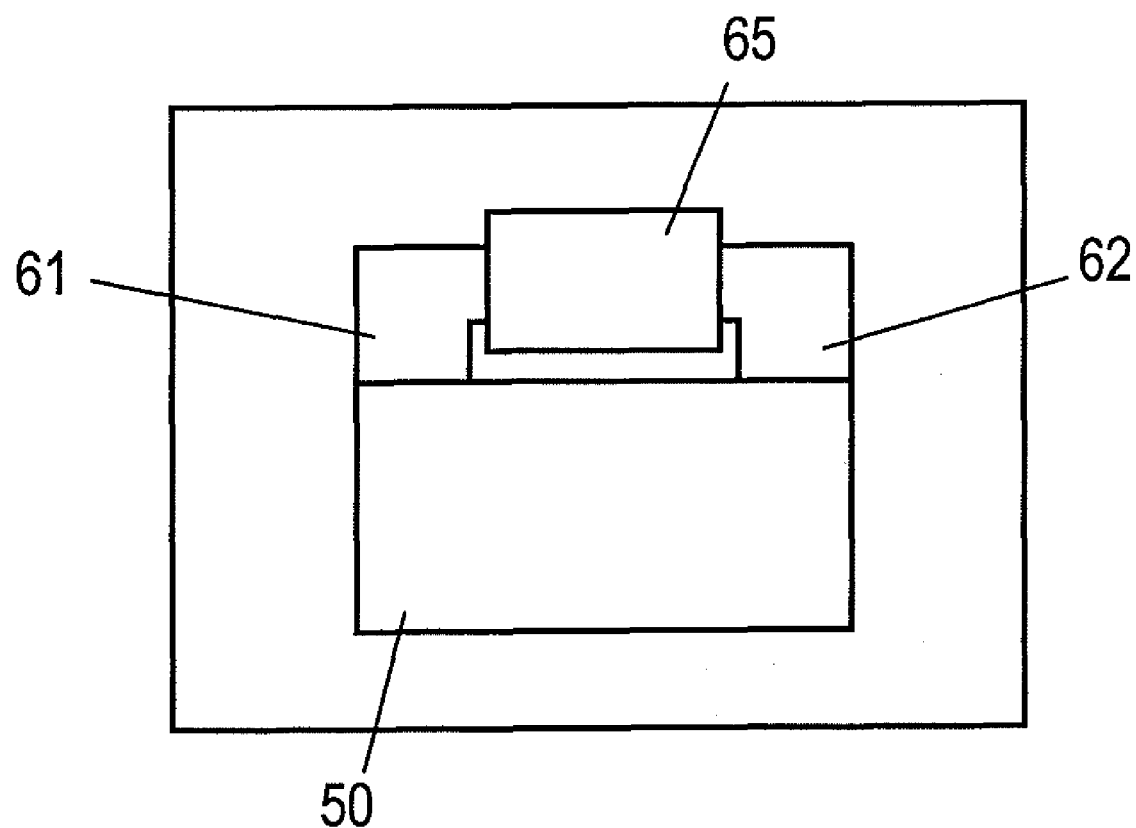
FIG. 7 is a top view showing a state where the chip-type solid electrolytic capacitor shown in FIG. 6 and a chip inductor are mounted on the printed board shown in FIG. 5.

Next, a π-type filter employing chip-type solid electrolytic capacitor (hereinafter referred to as "capacitor") 21 having laminated body 1A of a different structure is described. FIG. 4A through FIG. 4F show a structure of another capacitor 21 in accordance with the exemplary embodiment of the present invention. FIG. 4A is a plan sectional view, FIG. 4B is a front sectional view taken along the line 4B-4B of FIG. 4A, FIG. 4C is a left side sectional view taken along the line 4C-4C of FIG. 4A, and FIG. 4D is a right side sectional view taken along the line 4D-4D of FIG. 4A. FIG. 4E is a bottom sectional view taken along the line 4E-4E of FIG. 4B, and FIG. 4F is a bottom view.

In this structure, a plurality of capacitor elements 1 are aligned in a manner that positive electrode sections 2 are in the same direction, and are stacked to form element unit 41. In FIG. 4B through FIG. 4D, as an example, three capacitor elements 1 are stacked to form element unit 41. A plurality of element units 41 having such a structure are stacked so that positive electrode sections 2 are disposed in the alternately opposite directions. In FIG. 4B through FIG. 4D, as an example, two element units 41 are stacked. Thus, laminated body 1A is formed. Positive electrode lead frames 4A and 4B are disposed so as to join positive electrode sections 2 to positive electrode terminals 6. They are joined by resistance welding or the like. Positive electrode lead frames 4A and 4B are not always required, and positive electrode sections 2 may be directly coupled to positive electrode terminals 6. Stacking a plurality of capacitor elements 1 to form element unit 41 in this manner improves the workability and assembling precision.

In the present embodiment, the example where element unit 41 is formed by stacking three capacitor elements 1 has been described. However, the present invention is not limited to this. The number of stacked capacitor elements 1 may be appropriately determined in response to a desired specification or workability. The number of stacked element units 41 may be odd. When the number of stacked element units is even, however, the magnetic fluxes generated by currents flowing in capacitor elements 1 can cancel each other. Therefore, even-numbered element units 41 are more preferable.

The structure of FIG. 4A through FIG. 4F where laminated body 1A is formed of a plurality of element units 41 may be combined with board 11 or board 11A described by FIG. 1 or FIG. 3, thereby forming a π-type filter.

As described above, a filter formed by mounting a chip-type solid electrolytic capacitor on a printed board of the present invention allows the ESL to be significantly reduced, and hence the filter can be downsized. In addition, a chip inductor is not required. Therefore, the filter is useful especially for a field or the like requiring the high-frequency responsiveness.

The invention claimed is:

1. A printed board to be mounted with a chip-type solid electrolytic capacitor of a four-terminal structure having a pair of positive electrode terminals and a pair of negative electrode terminals on a mounting surface, the pair of positive electrode terminals being disposed at opposite positions and the pair of negative electrode terminals being disposed at opposite positions, and a coupling direction of the pair of positive electrode terminals being across a coupling direction of the pair of negative electrode terminals, the printed board comprising:
   a pair of positive electrode patterns to be coupled to the positive electrode terminals of the chip-type solid electrolytic capacitor;
   a pair of negative electrode patterns to be coupled to the negative electrode terminals of the chip-type solid electrolytic capacitor; and
   an inductor section insulated from the negative electrode patterns, and electrically coupling the positive electrode patterns.

2. The printed board according to claim 1, wherein a current path of the inductor section is longer than a distance between the pair of positive electrode patterns.

3. A filter comprising:
   a chip-type solid electrolytic capacitor of a four-terminal structure having a pair of positive electrode terminals and a pair of negative electrode terminals on a mounting surface, the pair of positive electrode terminals being disposed at opposite positions and the pair of negative electrode terminals being disposed at opposite positions, and a coupling direction of the pair of positive electrode terminals being across a coupling direction of the pair of negative electrode terminals; and
   a printed board mounted with the chip-type solid electrolytic capacitor, the printed board having
      a pair of positive electrode patterns coupled to the positive electrode terminals of the chip-type solid electrolytic capacitor,
      pair of negative electrode patterns coupled to the negative electrode terminals of the chip-type solid electrolytic capacitor, and an inductor section insulated from the negative electrode patterns and electrically coupling the positive electrode patterns.

4. The filter according to claim 3, wherein a current path of the inductor section is longer than a distance between the pair of positive electrode patterns.

5. The filter according to claim 3, wherein the chip-type solid electrolytic capacitor further has: a laminated body including a first group formed of at least one plate-shaped capacitor element having a positive electrode section and a negative electrode section, and a second group formed by stacking at least one plate-shaped capacitor element having a positive electrode section and a negative electrode section, wherein the negative electrode section of the at least one capacitor element in the first group and the negative electrode section of the at least one capacitor element in the second group are stacked, the positive electrode section of the at least one capacitor element in the first group being disposed on an opposite side to the positive electrode section of the at least one capacitor element in the second group with respect to the negative electrode section; and an insulating outer resin covering the laminated body in a state where parts of the positive electrode terminals and parts of the negative electrode terminals are exposed; wherein the pair of positive electrode terminals are electrically coupled to the positive electrode section of the at least one capacitor element in the first group and the positive electrode section of the at least one capacitor element in the second group, respectively; and wherein the pair of negative electrode terminals are electrically coupled to the negative electrode sections of the capacitor elements in the first group and the second group, and are disposed at both ends in the direction crossing the coupling direction between the pair of positive electrode terminals, respectively.

6. The filter according to claim 5, wherein
the at least one capacitor element of the first group comprises a plurality of capacitor elements, and the at least one capacitor element of the second group comprises a plurality of capacitor elements; and
the capacitor elements in the first group are respectively stacked alternately with the capacitor elements in the second group.

7. The filter according to claim 5, wherein the at least one capacitor element of the first group comprises a plurality of capacitor elements, and the at least one capacitor element of the second group comprises a plurality of capacitor elements; and a number of the capacitor elements in the first group is equal to a number of the capacitor elements in the second group.

8. The filter according to claim 5, wherein
the at least one capacitor element of the first group comprises a plurality of capacitor elements, and the at least one capacitor element of the second group comprises a plurality of capacitor elements; and
the capacitor elements in the first group are directly stacked to form an element unit, and the capacitor elements in the second group are directly stacked to form another element unit, and the element unit of the capacitor elements in the first group and the element unit of the capacitor elements in the second group are stacked to form the laminated body.

* * * * *